(12) United States Patent
Kim (10) Patent No.: US 9,412,800 B2
(45) Date of Patent: Aug. 9, 2016

(54) THIN FILM TRANSISTOR ARRAY SUBSTRATE AND ORGANIC LIGHT-EMITTING DISPLAY APPARATUS INCLUDING THE SAME

(71) Applicant: SAMSUNG DISPLAY CO., LTD., Yongin, Gyeonggi-Do (KR)

(72) Inventor: Hyun-Tae Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 11 days.

(21) Appl. No.: 14/316,887

(22) Filed: Jun. 27, 2014

(65) Prior Publication Data

US 2015/0102303 A1  Apr. 16, 2015

(30) Foreign Application Priority Data

Oct. 14, 2013 (KR) .......................... 10-2013-0122213

(51) Int. Cl.
*H01L 27/32* (2006.01)
(52) U.S. Cl.
CPC ........ *H01L 27/3262* (2013.01); *H01L 27/3265* (2013.01); *H01L 27/3276* (2013.01)
(58) Field of Classification Search
CPC .................................................. H01L 51/0545
USPC .......................................................... 257/40
See application file for complete search history.

(56) References Cited

U.S. PATENT DOCUMENTS

| 2003/0222589 A1* | 12/2003 | Osame ................. G09G 3/3233 315/169.1 |
| 2008/0308797 A1* | 12/2008 | Akimoto ............. H01L 27/1225 257/43 |
| 2014/0034923 A1 | 2/2014 | Kim et al. |
| 2014/0077176 A1 | 3/2014 | Lee et al. |

FOREIGN PATENT DOCUMENTS

| JP | 06-295997 A | 10/1994 |
| JP | 10-079439 A | 3/1998 |
| KR | 10-2008-0022447 A | 3/2008 |
| KR | 10-2014-0018623 A | 2/2014 |
| KR | 10-2014-0037715 A | 3/2014 |

\* cited by examiner

*Primary Examiner* — Edward Wojciechowicz
(74) *Attorney, Agent, or Firm* — Lee & Morse, P.C.

(57) ABSTRACT

A substrate includes a driving transistor, a capacitor, a driving voltage line, and a connection line. The driving transistor has a gate electrode overlapping a channel region of a curved active layer. The capacitor has a first electrode is formed of the gate electrode of the driving transistor and a second electrode overlapping the first electrode. The driving voltage line includes driving voltage line portions on the capacitor and connected to edges of the second electrode of the capacitor. The first connection line is located at a portion of a region on the capacitor separated from the driving voltage line. A via hole is on the first connection line.

15 Claims, 10 Drawing Sheets

THIN FILM TRANSISTOR ARRAY SUBSTRATE AND ORGANIC LIGHT-EMITTING DISPLAY APPARATUS INCLUDING THE SAME

CROSS-REFERENCE TO RELATED APPLICATION

Korean Patent Application No. 10-2013-0122213, filed on Oct. 14, 2013, and entitled, "Thin Film Transistor Array Substrate And Organic Light-Emitting Display Apparatus Including The Same," is incorporated by reference herein in its entirety.

BACKGROUND

1. Field

One or more embodiments described herein relates to a thin film transistor array substrate and an oragnic light emitting display device including the same.

2. Description of the Related Art

An organic light-emitting display apparatus has attracted attention as image display apparatus. An organic light-emitting display apparatus includes a plurality of pixels, each including a pixel circuit connected to signal lines on a substrate. Each pixel emits light from an organic light-emitting device controlled by the pixel circuit.

SUMMARY

In accordance with one embodiment, a thin film transistor array substrate includes a driving thin film transistor including a curved active layer and a gate electrode overlapping a channel region of the active layer; a capacitor having a first electrode including the gate electrode of the driving thin film transistor and a second electrode overlapping the first electrode; a driving voltage line including driving voltage line portions on the capacitor and connected to edges of the second electrode of the capacitor; and a first connection line at a portion of a region on the capacitor separated from the driving voltage line, wherein a portion of first connection line is exposed through a via hole.

The first connection line may have a first portion parallel to the driving voltage line, and a second portion having a greater width than the first portion, wherein the via hole is disposed at the second portion.

The substrate may include a compensation thin film transistor to compensate for a threshold voltage of the driving thin film transistor; and a second connection line to connect the first electrode of the capacitor and the compensation thin film transistor. The second connection line may be connected to an edge of the first electrode of the capacitor. The driving voltage line, first connection line, and second connection may be on a same layer. The second portion of the first connection line may be formed as a third electrode of the capacitor and may overlap the second electrode of the capacitor.

The substrate may include a first insulating layer covering the active layer; a second insulating layer covering the first electrode of the capacitor; a third insulating layer covering the second electrode of the capacitor; and a fourth insulating layer covering the first connection line.

The substrate may include an emission control thin film transistor connected to one end of the first portion of the first connection line and turned on by an emission control signal transmitted through an emission control line, wherein the emission control thin film transistor is to transmit a driving current from the driving thin film transistor to an organic light-emitting device. The organic light-emitting device may have a pixel electrode connected to the first connection line through the via hole. The second electrodes of the capacitors of pixels adjacent in a horizontal direction may be connected to each other, and the driving voltage line may havbe a mesh structure.

In accordance with another embodiment, an organic light-emitting display apparatus includes a driving thin film transistor having a curved active layer and a gate electrode on the active layer and overlapping a channel region of the active layer; a capacitor having a first electrode including the gate electrode of the driving thin film transistor, and a second electrode overlapping the first electrode; a driving voltage line including driving voltage line portions on the capacitor and connected to edges of the second electrode of the capacitor; a first connection line at a portion of a region on the capacitor separated from the driving voltage line, wherein a portion of first connection line is exposed through a via hole; and an organic light-emitting device to emit light based on driving current from the driving thin film transistor.

The first connection line may have a first portion parallel to the driving voltage line; and a second portion having a greater width than the first portion, wherein the via hole is disposed at the second portion.

The apparatus may include a compensation thin film transistor to compensate for a threshold voltage of the driving thin film transistor; and a second connection line connecting the first electrode of the capacitor and the compensation thin film transistor. The second connection line may be connected to an edge of the first electrode of the capacitor. The driving voltage line, first connection line, and second connection may be on a same layer. The first connection line may be formed as a third electrode of the capacitor and may overlap the second electrode of the capacitor.

The apparatus may include a first insulating layer covering the active layer; a second insulating layer covering the first electrode of the capacitor; a third insulating layer covering the second electrode of the capacitor; and a fourth insulating layer covering the first connection line.

The apparatus may include an emission control thin film transistor connected to one end of the first portion of the first connection line and turned on by an emission control signal transmitted through an emission control line, the emission control thin film transistor to transmit the driving current from the driving thin film transistor to the organic light-emitting device.

A pixel electrode of the organic light-emitting device may be connected to the first connection line through the via hole. The second electrodes of the capacitors of pixels adjacent in a horizontal direction may be connected to each other, and the driving voltage line may have a mesh structure.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
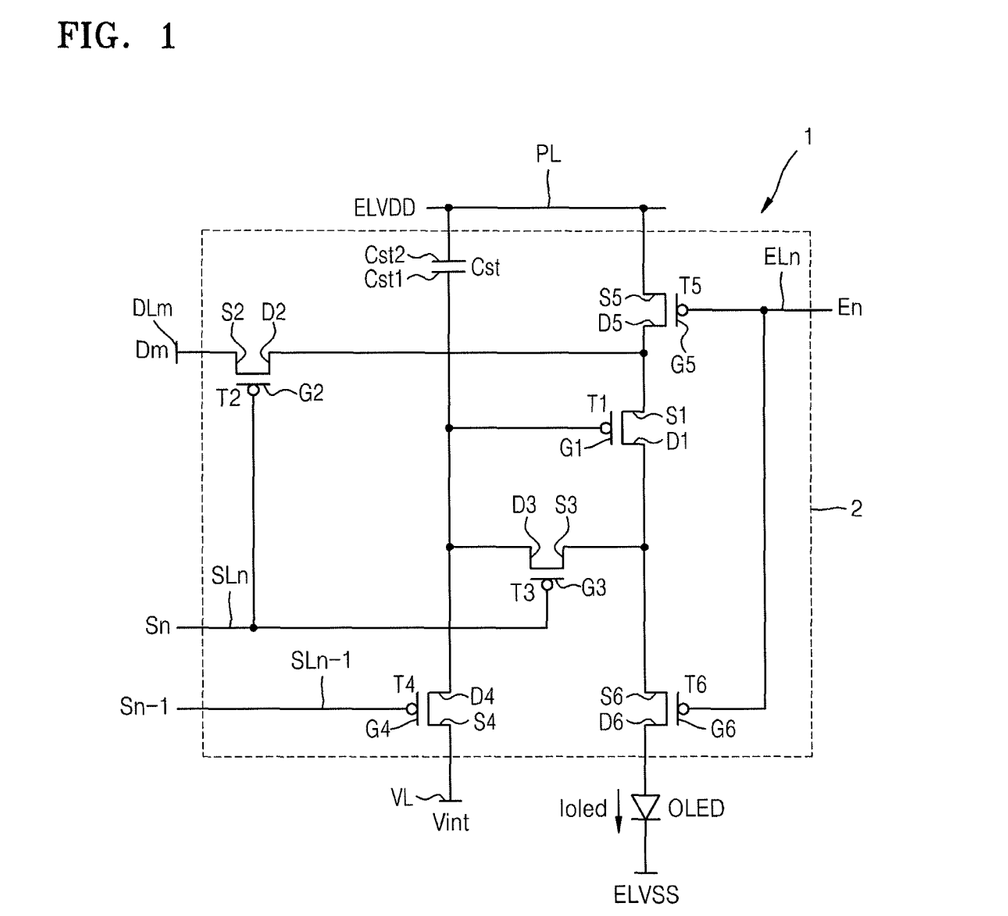
FIG. 1 illustrates an embodiment of a pixel.

FIG. 1 illustrates an embodiment of a pixel 1 of an organic light-emitting display apparatus. The pixel 1 is one of a plurality of pixels an nth row line (e.g., pixel line). The pixel 1 is connected to a scan line SLn corresponding to the nth row line and to a scan line SLn-1 corresponding to an (n–1)th row line previous to the nth row line. The pixel 1 is connected to a scan line corresponding to a respective pixel line and to a scan line corresponding to a prior pixel line. In other embodiments, pixel 1 may be connected to two scan lines.

The pixel 1 includes a pixel circuit 2 having a plurality of thin film transistors T1 to T6 and a capacitor Cst. The pixel 1 also includes an organic light-emitting device (OLED) to emit light based on a driving current from pixel circuit 2. The thin film transistors T1 to T6 include a driving thin film transistor T1, a switching thin film transistor T2, a compensation thin film transistor T3, an initialization thin film transistor T4, a first emission control thin film transistor T5, and a second emission control thin film transistor 6.

The pixel 1 includes a first scan line SLn to transmit a first scan signal Sn to the switching thin film transistor T2 and compensation thin film transistor T3, a second scan line SLn-1 to transmit a second scan signal Sn-1 (which is a previous scan signal) to initialization thin film transistor T4, an emission control line ELn to transmit an emission control signal En to first emission control thin film transistor T5 and second emission control thin film transistor T6, a data line DLm which intersects first scan line SLn and transmits a data signal Dm, a driving voltage line PL which is substantially parallel to data line DLm and transmits a first power supply voltage ELVDD, and an initialization voltage line VL which is substantially parallel to second scan line SLn-1 and transmits an initialization voltage Vint to initialize driving thin film transistor T1.

A gate electrode G1 of the driving thin film transistor T1 is connected to a first electrode Cst1 of the capacitor Cst. A source electrode S1 of the driving thin film transistor T1 is connected to the driving voltage line PL via the first emission control thin film transistor T5. A drain electrode D1 of the driving thin film transistor T1 is electrically connected to an anode electrode of the OLED via the second emission control thin film transistor T6. According to a switching operation of the switching thin film transistor T2, the driving thin film transistor T1 receives the data signal Dm and supplies a driving current Ioled to the OLED.

A gate electrode G2 of the switching thin film transistor T2 is connected to the first scan line SLn. A source electrode S2 of the switching thin film transistor T2 is connected to the data line DLm. A drain electrode D2 of the switching thin film transistor T2 is connected to the source electrode S1 of the driving thin film transistor T1 and is connected to the driving voltage line PL via the first emission control thin film transistor T5. In a switching operation, the switching thin film transistor T2 is turned on according to the first scan signal Sn received through the first scan line SLn. When transistor T2 turns on, data signal Dm received through the data line DLm is transmitted to the source electrode Si of the driving thin film transistor T1.

A gate electrode G3 of the compensation thin film transistor T3 is connected to the first scan line SLn. A source electrode S3 of the compensation thin film transistor T3 is connected to the drain electrode D1 of the driving thin film transistor T1. Source electrode S3 is also connected to the anode electrode of the OLED via the second emission control thin film transistor T6. A drain electrode D3 of the compensation thin film transistor T3 is connected in common to the first electrode Cst1 of the capacitor Cst, a drain electrode D4 of the initialization thin film transistor T4, and the gate electrode G1 of the driving thin film transistor T1. The compensation thin film transistor T3 is turned on according to the first scan line Sn received through the first scan line SLn. When transistor T3 turns on, the gate electrode G1 and drain electrode D1 of the driving thin film transistor T1 are connected, thereby placing transistor T1 in a diode-connected stated.

A gate electrode G4 of the initialization thin film transistor T4 is connected to the second scan line SLn-1. A source electrode S4 of the initialization thin film transistor T4 is connected to the initialization voltage line VL. The drain electrode D4 of the initialization thin film transistor T4 is connected, in common, to the first electrode Cst1 of the capacitor Cst, the drain electrode D3 of the compensation thin film transistor T3, and the gate electrode G1 of the driving thin film transistor T1. In an initialization operation, the initialization thin film transistor T4 is turned on according to the second scan line Sn-1 received through the second scan line SLn-1. When transistor T4 turns on, the initialization voltage Vint is transmitted to the gate electrode G1 of the driving thin film transistor T1, to initialize a voltage of the gate electrode G1 of the driving thin film transistor T1.

A gate electrode G5 of the first emission control thin film transistor T5 is connected to the emission control line ELn. A source electrode S5 of the first emission control thin film transistor T5 is connected to the driving voltage line PL. A drain electrode D5 of the first emission control thin film transistor T5 is connected to the source electrode S1 of the driving thin film transistor T1 and drain electrode D2 of the switching thin film transistor T2.

A gate electrode G6 of the second emission control thin film transistor T6 is connected to the emission control line ELn. A source electrode S6 of the second emission control the thin film transistor T6 is connected to the drain electrode D1 of the driving thin film transistor T1 and the source electrode S3 of the compensation thin film transistor T3. A drain electrode D6 of the second emission control thin film transistor T6 is electrically connected to the anode electrode of the OLED. According to the emission control signal En received through the emission control line ELn, the first emission control the thin film transistor T5 and second emission the control thin film transistor T6 are simultaneously turned on. When the transistors T5 and T6 are simultaneously turned on, the first power supply voltage ELVDD is transmitted to thereby allow driving current Ioled to flow through the OLED.

A second electrode Cst2 of the capacitor Cst is connected to the driving voltage line PL. The first electrode Cst1 of the capacitor Cst is connected, in common, to the gate electrode 01 of the driving thin film transistor T1, the drain electrode D3 of the compensation thin film transistor T3, and the drain electrode D4 of the initialization thin film transistor T4.

A cathode electrode of the OLED is connected to a second power supply voltage ELVSS. The OLED receives the driving current Ioled from the driving thin film transistor T1 and emits light to display an image. The first power supply voltage ELVDD may be a predetermined high-level voltage. The second power supply voltage ELVSS may be a ground voltage or a voltage lower than the first power supply voltage ELVDD.

Figure 2:
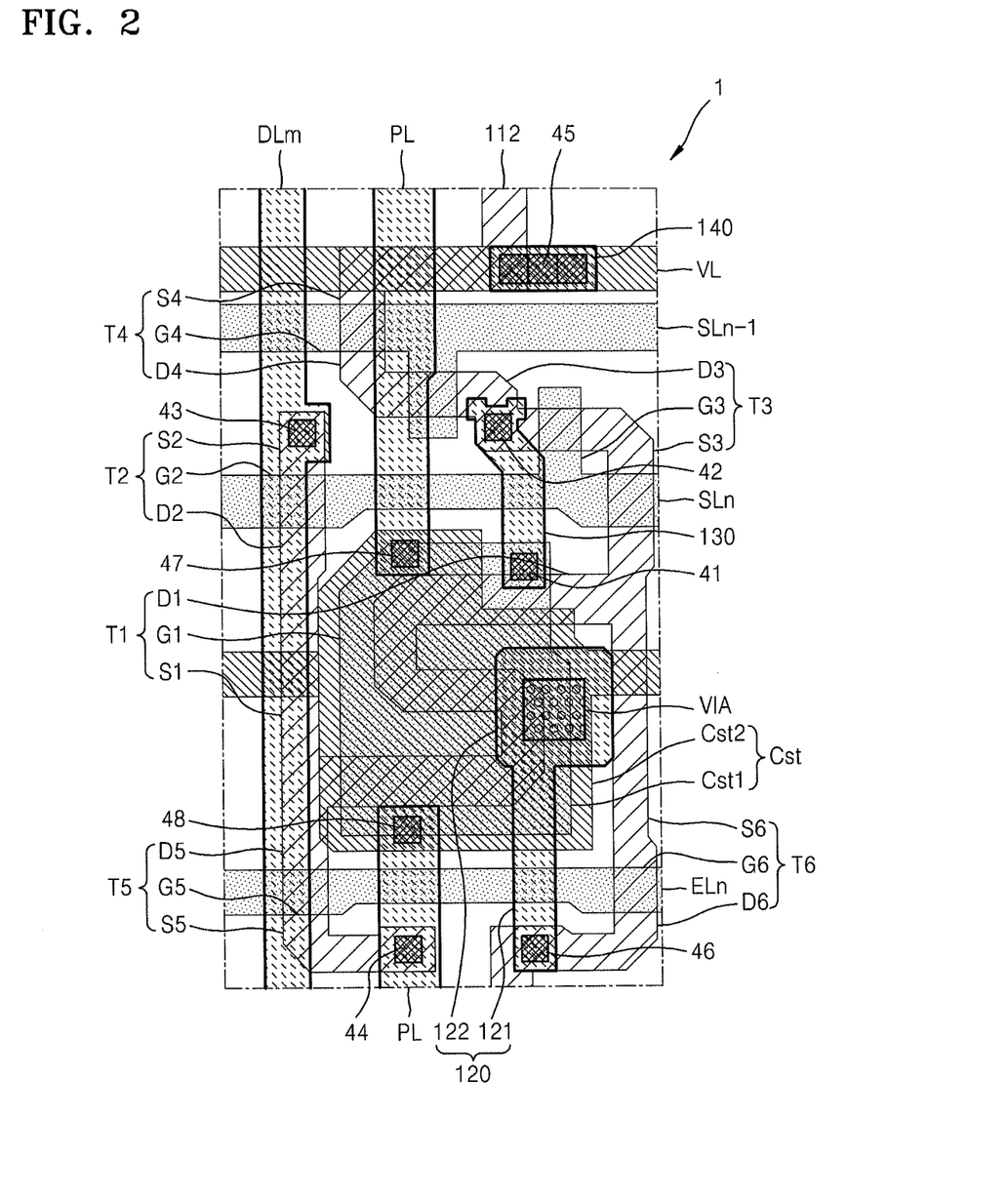
FIG. 2 illustrates a plan view of the pixel.

FIG. 2 illustrates a plan view of pixel 1. As illustrated in FIG. 2, pixel 1 includes the first scan line SLn, the second scan line SLn-1, the emission control line ELn, and the initialization voltage line VL disposed in a row direction. These lines respectively apply the first scan signal Sn, the second scan signal Sn-1, the emission control signal En, and the initialization voltage Vint. The data line DLm and the driving voltage line PL are disposed across the first scan line SLn, the second scan line SLn-1, the emission control line ELn, and the initialization voltage line VL. The data line DLm and the driving voltage line PL respectively apply the data signal Dm and the first power supply voltage ELVDD to the pixel 1.

A plurality of thin film transistors T1 to T6 and a capacitor Cst are formed in the pixel 1. In other embodiments, pixel 1 may have a different structure, e.g., with a different number of transistors and/or capacitors. Also, the OLED may be formed in a region corresponding to a via hole VIA.

The thin film transistors T1 to T6 are formed along an active layer 112. The active layer 112 may curved in various shapes. The active layer 112 includes a channel region that is not doped with a dopant and that is formed of polysilicon, for example. The active layer 112 may also include a source region and a drain region doped with a dopant and formed on respective sides of the channel region. The dopant material depends on the conductivity type of the thin film transistor to be implemented, e.g., the dopant may be an N-type dopant material or a P-type dopant material.

The driving thin film transistor T1 includes a gate electrode G1, a source electrode S1, and a drain electrode D1. The source electrode Si corresponds to a doped source region in the active layer. The drain electrode D1 corresponds to a doped drain region in the active layer. The gate electrode G1 overlaps the channel region. The gate electrode G1 is connected to the first electrode Cst1 of the capacitor Cst, the drain electrode D3 of the compensation thin film transistor T3, and the drain electrode D4 of the initialization thin film transistor T4, through contact holes 41 and 42 by a second connection member 130. In this embodiment, the active layer of the driving thin film transistor T1 is curved. In the example of FIG. 2, the active layer of the driving thin film transistor T1 has a "2"-shaped configuration.

By forming a curved active layer, a long active layer may be formed in a relatively narrow space. Because a long channel region may be formed in the active layer of the driving thin film transistor T1, the driving range of a gate voltage applied to the gate electrode G1 may be increased. The increased driving range of the gate voltage allows gray scale values of light emitted from the OLED to be controlled more accurately, e.g., by changing the level of the gate voltage. Accordingly, the resolution of the display apparatus may be increased and display quality may be improved. The active layer of the driving thin film transistor T1 may be embodied in various curved shapes such as but not limited to an S, M, or W shape.

The switching thin film transistor T2 includes a gate electrode G2, a source electrode S2, and a drain electrode D2. The source electrode S2 corresponds to a doped source region in the active layer, The drain electrode D2 corresponds to a doped drain region in the active layer. The gate electrode G2 overlaps the channel region. The source electrode S2 is connected to the data line DLm through a contact hole 43. The drain electrode D2 is connected to the source electrode S1 of the driving thin film transistor T1 and drain electrode D5 of the first emission control thin film transistor T5. The gate electrode G2 is formed by a portion of the first scan line SLn.

The compensation thin film transistor T3 includes a gate electrode G3, a source electrode S3, and a drain electrode D3. The source electrode S3 corresponds to a doped source region in the active layer. The drain electrode D3 corresponds to a doped drain region in the active layer. The gate electrode G3 overlaps the channel region and is formed by a portion of the first scan line SLn.

The initialization thin film transistor T4 includes a gate electrode G4, a source electrode S4, and a drain electrode D4. The source electrode S4 corresponds to a doped source region in the active layer. The drain electrode D4 corresponds to a doped drain region in the active layer. The source electrode S4 may be connected to the initialization voltage line VL through a contact hole 45 by a third connection member 140. The gate electrode G4 overlaps the channel region. The gate electrode G4 is formed as a dual-gate electrode by a portion of the second scan line SLn-1 to prevent leakage current.

The first emission control thin film transistor T5 includes a gate electrode G5, a source electrode S5, and a drain electrode D5. The source electrode S5 corresponds to a doped source region in the active layer. The drain electrode D5 corresponds to a doped drain region in the active layer. The gate electrode G5 overlaps the channel region. The source electrode S5 may be connected to the driving voltage line PL through a contact hole 44. The gate electrode G5 is formed by a portion of the emission control line ELn.

The second emission control thin film transistor T6 includes a gate electrode G6, a source electrode S6, and a drain electrode D6. The source electrode S6 corresponds to a doped source region in the active layer. The drain electrode D6 corresponds to a doped drain region in the active layer. The gate electrode G6 overlaps the channel region. The drain electrode D6 is connected to the first connection member 120 through a contact hole 46 and is connected to the anode electrode of the OLED through a via hole VIA. The gate electrode G6 is formed by a portion of emission control line ELn.

The first electrode Cst1 of the capacitor Cst is connected, in common, to the drain electrode D3 of the compensation thin film transistor T3 and the drain electrode D4 of the initialization thin film transistor T4, by the second connection member 130, through the contact holes 41 and 42. The first electrode Cst1 of the capacitor Cst also functions as the gate electrode G1 of the driving thin film transistor T1. The second electrode Cst2 of the capacitor Cst is connected to the driving voltage line PL through the contact holes 47 and 48, to receive the first power supply voltage ELVDD from the driving voltage line PL.

The first electrode Cst1 of the capacitor Cst is formed in a tetragonal shape, separated from the adjacent pixel. The first electrode Cst1 may be formed of the same material and on the same layer as the first scan line SLn, the second scan line SLn-1, emission control line ELn, the gate electrode G5 of first emission control thin film transistor T5, and the gate electrode G6 of the second emission control thin film transistor T6.

The second electrode Cst2 of the capacitor Cst is connected to that of the adjacent pixel. The second electrode Cst2 may be formed of the same material and on the same layer as the initialization voltage line VL. The second electrode Cst2 of the capacitor Cst may completely overlap the first electrode Cst1 and may vertically overlap the driving thin film transistor T1. In order to ensure a region of the capacitor Cst, which is reduced due to the curved active layer of the driving thin film transistor T1, the capacitor Cst overlaps the active layer of the driving thin film transistor T1, to thereby ensure capacitance even at a high resolution.

The data line DLm is disposed in a first (e.g., vertical) direction on the left or right side of the pixel. The data line DLm is connected to the switching thin film transistor T2 through the contact hole 43.

The driving voltage line PL is disposed in the first direction on the left or right side of the pixel, adjacent to data line DLm. The driving voltage line PL is disconnected without intersecting a region in which the driving thin film transistor T1 and capacitor Cst are formed. That is, while extending in the first direction, the driving voltage line PL may be separated on the capacitor Cst such that a space, through which a line does not pass, may be formed on the capacitor Cst. Because of this separation, a portion of the driving voltage line PL on capacitor Cst is connected to a top edge of the second electrode Cst2 of the capacitor Cst through contact hole 47. Another portion of the driving voltage line PL under capacitor Cst is connected to a bottom edge of the second electrode Cst2 of the capacitor Cst through contact hole 48.

Because the second electrode Cst2 of the capacitor Cst is connected between adjacent pixels in a second (e.g., horizontal) direction, the driving voltage line PL may have a mesh structure that is connected in the first direction and the second direction. The driving voltage line PL may be connected to the first emission control thin film transistor T5 through the contact hole 44.

The first connection member 120 is connected to the drain electrode D6 of the second emission control thin film transistor T6 through the contact hole 46 The first connection member 120 is also connected to the anode electrode of the OLED through via hole VIA. Accordingly, first connection member 120 may connect the OLED to the driving thin film transistor T1 and the second emission control thin film transistor T6.

The first connection member 120 extends from the region, in which the drain electrode D6 of the second emission control thin film transistor T6 is formed, to the region in which the driving thin film transistor T1 and the capacitor Cst are formed. The first connection member 120 includes a first portion 121 parallel to the driving voltage line PL, and a second portion 122 formed at a portion of the region in which the driving voltage line PL is separated. The first portion 121 is substantially linear, and the second portion 122 is substantially tetragonal. The second portion 122 has a larger width than the first portion 121.

The via hole VIA is disposed at the second portion 122 of the first connection member 120, to partially overlap a driving thin film transistor T1 and the capacitor Cst in the first direction. The first portion 121 of the first connection member 120 has a width providing a sufficient distance to prevent a short circuit with the driving voltage line PL, that is disposed on the same layer as the first portion 121 adjacent to the first portion 121. The second portion 122 of the first connection member 122 is disposed on the capacitor Cst at a sufficient distance to prevent a short circuit with the data line DLm, that is on the same layer as the second portion 122.

The second connection member 130 is connected to the first electrode Cst1 of the capacitor Cst through the contact hole 41 at an edge of the first electrode Cst1, for example, at one corner of the first electrode Cst1. The second connection member 130 is connected to the drain electrode D3 of the compensation thin film transistor T3 through the contact hole 42. Accordingly, the second connection member 130 may connect capacitor Cst to the compensation thin film transistor T3 and the initialization thin film transistor T4.

The third connection member 140 may connect the source electrode S4 of the initialization thin film transistor T4 and the initialization voltage line VL through the contact hole 45.

Figure 3:
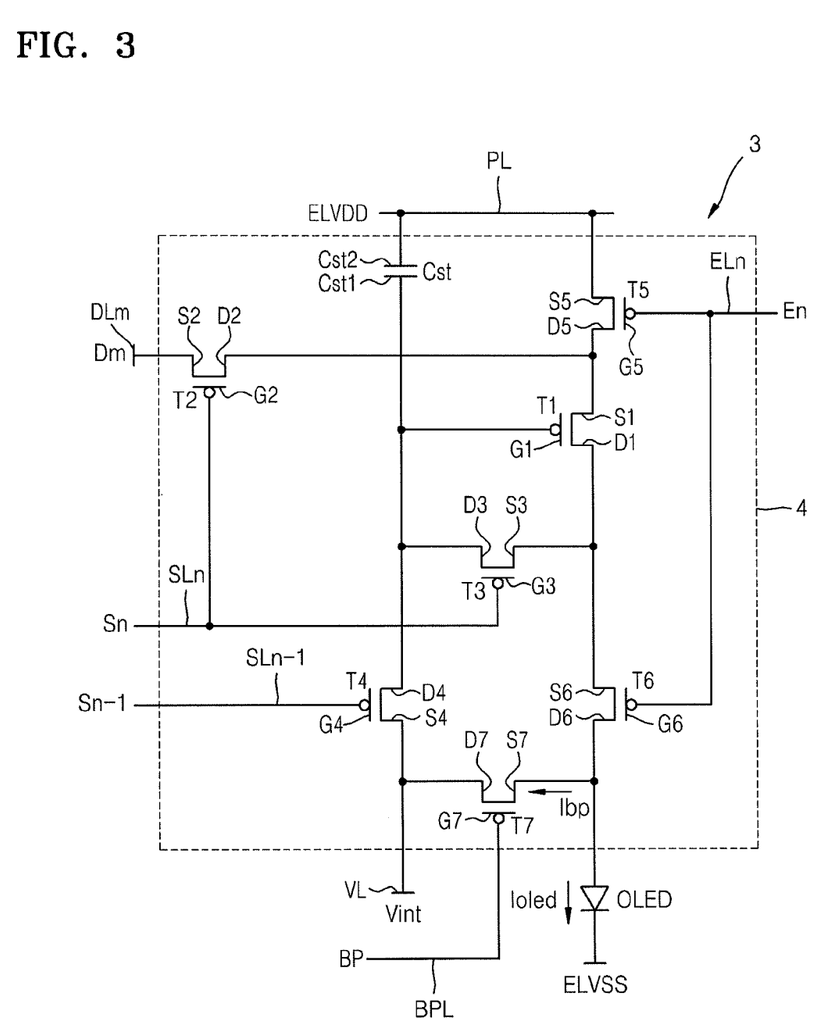
FIG. 3 illustrates another embodiment of a pixel.

FIG. 3 illustrates another embodiment of a pixel 3 of an organic light-emitting display apparatus. The pixel 3 may be the same as the pixel 1, except that a bypass thin film transistor T7 is added. Pixel 3 may be one of a plurality of pixels in an nth row line.

The pixel 3 is connected to a scan line SLn corresponding to the nth row line and to a scan line SLn-1 corresponding to an (n−1)th row line previous to the nth row line. The pixel 3 is connected to a scan line corresponding to a respective pixel line and to a scan line corresponding to a pixel line previous to the corresponding scan line. In other embodiments, pixel 3 may be connected to two scan lines.

Also, the pixel 3 includes a pixel circuit 4 having a plurality of thin film transistors T1 to T7 and a capacitor Cst. The pixel 3 further includes an OLED to emit light based on driving current from the pixel circuit 4. The thin film transistors T1 to T7 include the driving thin film transistor T1, the switching thin film transistor T2, the compensation thin film transistor T3, the initialization thin film transistor T4, the first emission control thin film transistor T5, the second emission control thin film transistor 6, and a bypass thin film transistor T7.

The pixel 3 includes a first scan line SLn to transmit a first scan signal Sn to the switching thin film transistor T2 and the compensation thin film transistor T3, a second scan line SLn-1 to transmit a second scan signal Sn-1, which is a previous scan signal, to the initialization thin film transistor T4, an emission control line ELn to transmit an emission control signal En to the first emission control thin film transistor T5 and the second emission control thin film transistor T6, a data line DLm disposed to intersect the first scan line SLn and to transmit a data signal Dm, a driving voltage line PL which is substantially parallel to the data line DLm and transmits a first power supply voltage ELVDD, an initialization voltage line VL substantially parallel to the second scan line SLn-1 and transmits an initialization voltage Vint to initialize the driving thin film transistor T1, and a bypass control line BPL to transmit a bypass signal BP to the bypass thin film transistor T7.

A gate electrode G7 of the bypass thin film transistor T7 is connected to the bypass control line BPL. A source electrode S7 of the bypass thin film transistor T7 is connected in common to a drain electrode D6 of the second emission control thin film transistor T6 and an anode electrode of the OLED. A drain electrode D7 of the bypass thin film transistor T7 is connected, in common, to the initialization voltage line VL and a source electrode S4 of the initialization thin film transistor T4. The gate electrode G7 overlaps a channel region of an active layer.

The bypass thin film transistor T7 receives the bypass signal BP from the bypass control line BPL. The bypass signal BP is a predetermined-level voltage that may always turn off the bypass thin film transistor T7. Because an off-level voltage is received at the gate electrode G7, the bypass thin film transistor T7 is always turned off, so that a portion (bypass current Ibp) of a driving current Ioled is output through the bypass thin film transistor T7 in the turn-off state.

When the OLED emits light (even in the case where a minimum current of the driving thin film transistor T1 displaying a black image flows as a driving current), a black image may not be properly displayed. Thus, bypass thin film transistor T7 may distribute a portion (e.g., bypass current Ibp) of the minimum current of the driving thin film transistor T1 to a current path different from the current path to the OLED.

In one embodiment, the minimum current of driving thin film transistor T1 may be understood to be a current generated under the condition that the driving thin film transistor T1 is turned off, since a gate-source voltage Vgs of the driving thin film transistor T1 is lower than a threshold voltage Vth thereof. The minimum driving current (e.g., a current of 10 pA or less), generated under the condition that the driving thin film transistor T1 is turned off, may be transmitted to the OLED so that black image is displayed.

When the minimum driving current corresponding to a black image flows, influence of the bypass transmission of the bypass current Ibp may be large. On the other hand, when a large driving current displaying a general image or a white image flows, influence of the bypass current Ibp may be relatively small. Thus, when a driving current displaying a black image flows, the driving current Ioled of the OLED may be a current reduced by a current amount of the bypass current Ibp output through the bypass thin film transistor T7. This reduced current may have a minimum current amount that corresponds to a level for clearly displaying a black image. Thus, the bypass thin film transistor T7 may be used to implement an accurate black image, thereby improving contrast ratio.

Figure 4:
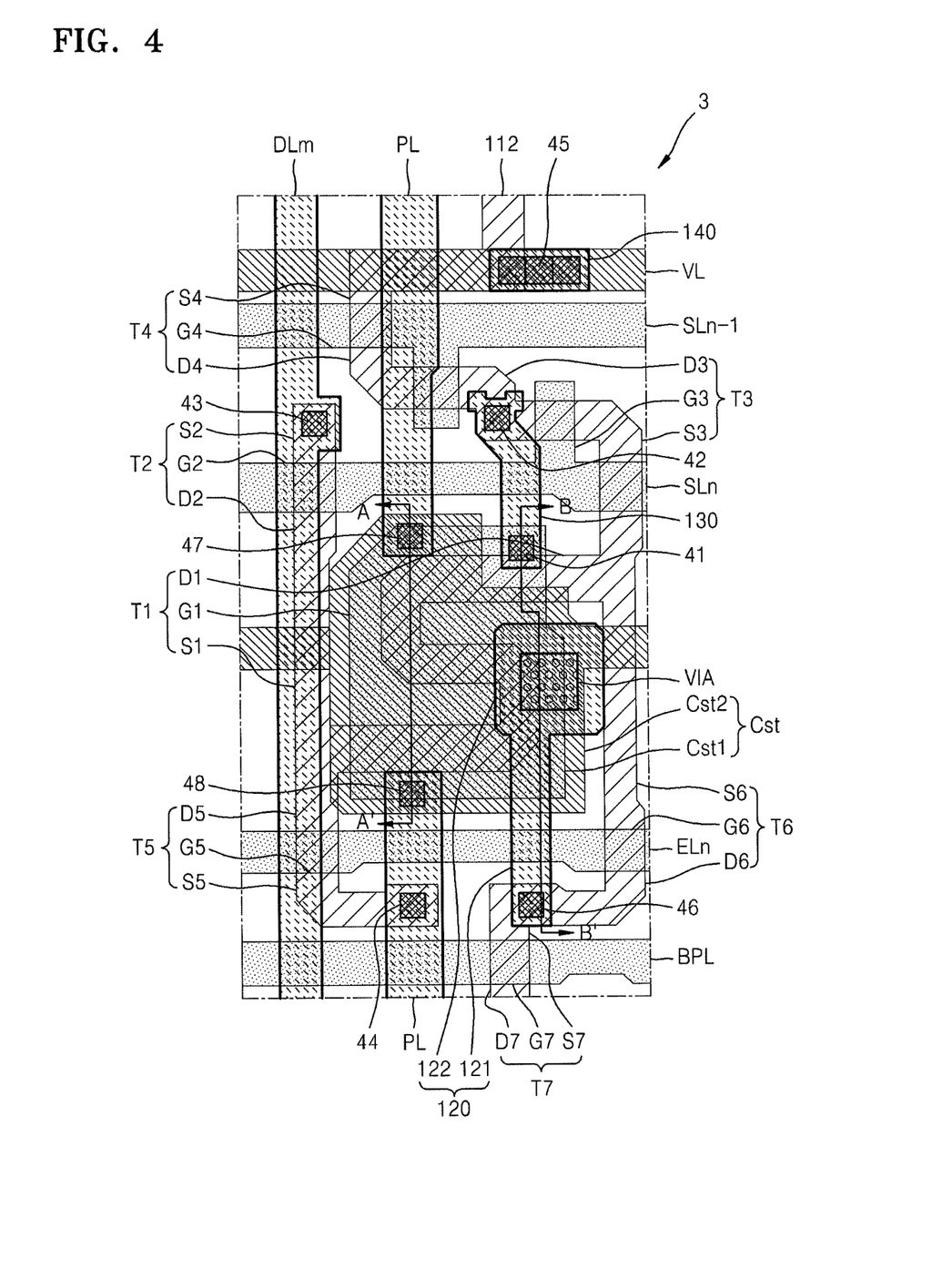
FIG. 4 illustrates a plan view of the pixel in FIG. 3.

FIG. 4 illustrates a plan view of the pixel 3 which includes: the first scan line SLn, the second scan line SLn-1, the emission control line ELn, the initialization voltage line VL, and the bypass control line BPL that are disposed in a row direction. These lines respectively apply the first scan signal Sn, the second scan signal Sn-1, the emission control signal En, the initialization voltage Vint, and the bypass signal BP. The data line DLm and the driving voltage line PL are disposed across the first scan line SLn, the second scan line SLn-1, the emission control line ELn, the initialization voltage line VL, and the bypass control line BPL. The data line DLM and the driving voltage line respectively apply the data signal Dm and the first power supply voltage ELVDD to pixel 3.

The pixel 3 includes the seven thin film transistors T1 to T7 and a capacitor Cst. In other embodiments, a different number of transistors and/or capacitors may be included. Also, the OLED may be formed in a region corresponding to a via hole VIA.

The thin film transistors T1 to T7 are formed along an active layer 112. The active layer 112 may curve in various shapes. The active layer 112 includes a channel region that is not doped with a dopant and is formed, e.g., of polysilicon. The active layer 112 also includes a source region and a drain region doped with a dopant material. The source and drain regions may be formed on respective sides of the channel region. The dopant material depends on the conductivity type of the thin film transistor, e.g., an N-type dopant material or a P-type dopant material.

The bypass thin film transistor T7 includes a gate electrode G7, a source electrode S7, and a drain electrode D7. The source electrode S7 corresponds to a doped source region in the active layer. The drain electrode D7 corresponds to a doped drain region in the active layer. The gate electrode G7 is connected to the bypass control line BPL. The source electrode S7 is directly connected to the drain electrode D6 of the second emission control thin film transistor T6. The drain electrode D7 is directly connected to the drain electrode D4 of the initialization thin film transistor T4.

Figure 5:
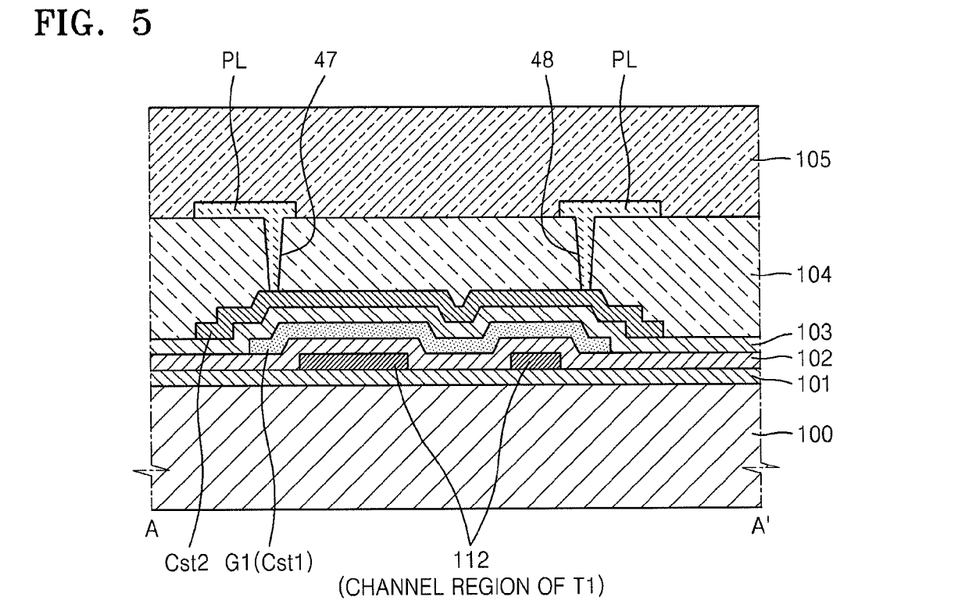
FIG. 5 illustrates a view along section line A-A' in FIG. 4.
Figure 6:
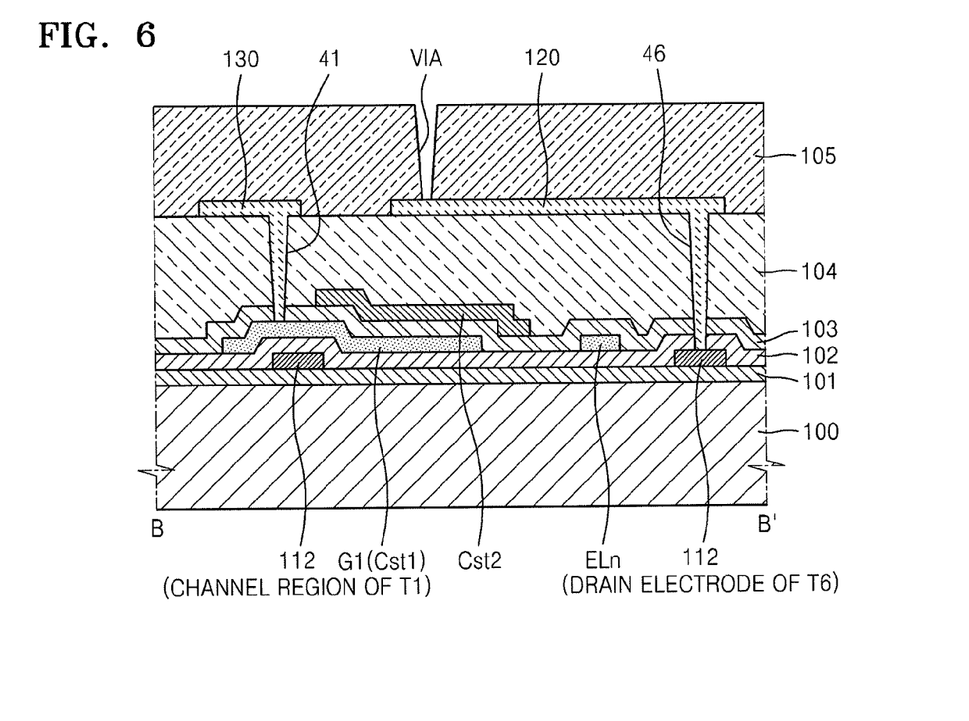
FIG. 6 illustrates a view along line section line B-B' in FIG. 4.
Figure 7:
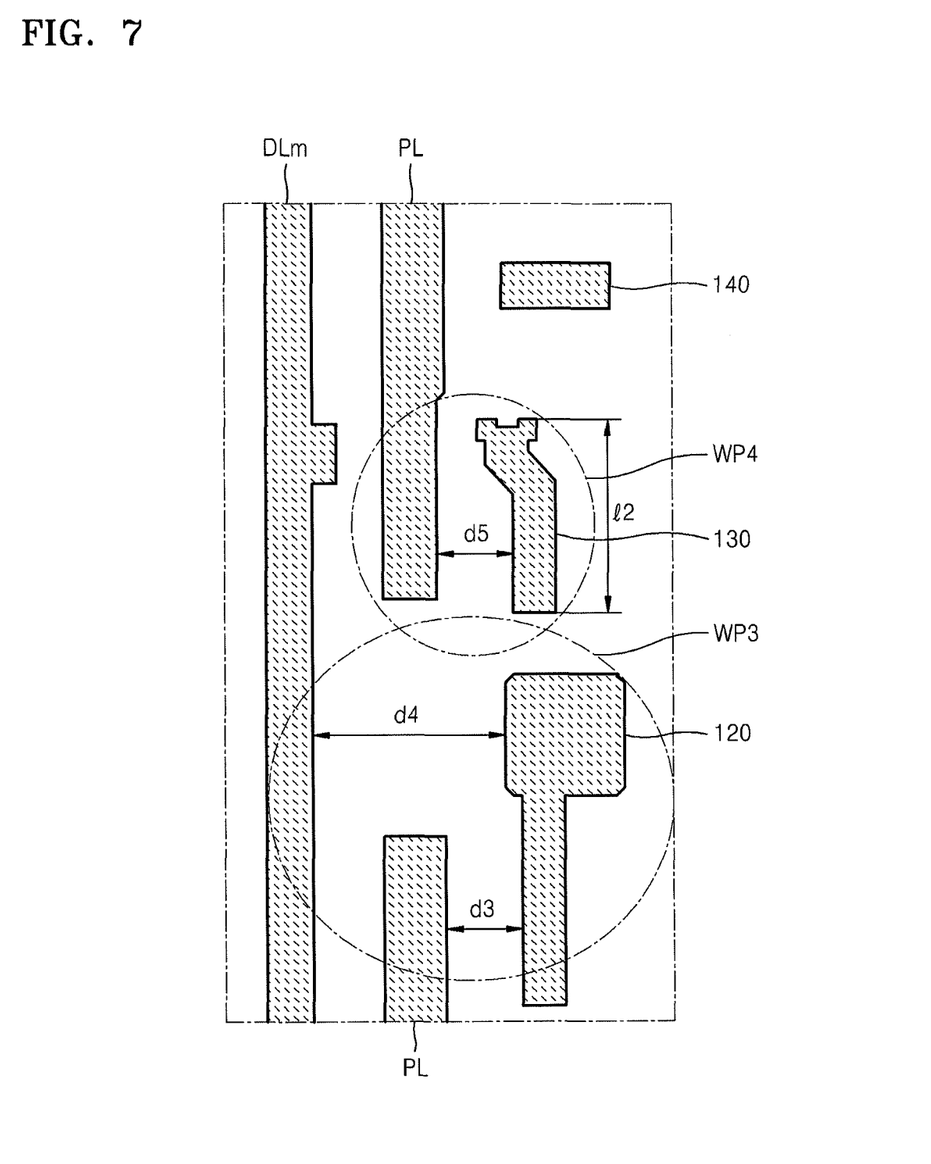
FIG. 7 illustrates a data line in FIG. 4.

FIG. 5 illustrates a view along section line A-A' in FIG. 4, FIG. 6 illustrates a view along section line B-B' in FIG. 4, and FIG. 7 illustrates a data line in FIG. 4. The following description focuses on the illustrative case of the driving thin film transistor T1 and the capacitor Cst. The other thin film transistors T2 to T7 may have substantially the same structure as the transistor T1. The embodiments of FIGS. 5 to 7 may also be similarly applied to pixel 1 in FIG. 2.

Referring to FIGS. 5 and 6, a buffer layer 101 is on a thin film transistor array substrate (e.g., substrate) 100. The substrate 100 may be a transparent glass substrate formed mainly of $SiO_2$. In other embodiments, the substrate 100 may be formed of one or more different materials, e.g., transparent plastic materials and metal materials. The buffer layer 101 may be optionally omitted.

An active layer 112 is on buffer layer 101. The active layer 112 may include a semiconductor, e.g., semiconductor oxide. The active layer 112 may be formed by depositing a semiconductor layer on substrate 100 and patterning and crystallizing the semiconductor layer according to an active layer pattern. Herein, the semiconductor layer may be patterned and then crystallized, or may be crystallized and then patterned. The crystallization may be performed by various processes, e.g., rapid thermal annealing (RTA), solid phase crystallization (SPC), excimer laser annealing (ELA), metal induced crystallization (MIC), metal induced lateral crystallization (MILC), sequential lateral solidification (SLS), and/or advanced sequential lateral solidification (ASLS). A thin film transistor is formed along the active layer 112.

A first insulating layer 102 is on the substrate 100 with the active layer 112 thereon. The first insulating layer 102 may have a multilayer structure, in which an organic insulating material and/or an inorganic insulating material are alternately formed.

The first gate wiring including the gate electrode G1 of the driving thin film transistor T1, the first electrode Cst1 of capacitor Cst, and the emission control line ELn is formed on the first insulating layer 102. The first gate wiring may further include the gate electrodes G2 to G7 of the thin film transistors T2 to T7, the first scan line SLn, the second scan line SLn-1, and the bypass control line BPL.

The first gate wiring may be formed to have a single-layer structure or a multilayer structure including a metal material, e.g., platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), aluminum (Al), copper (Cu), or an alloy thereof.

By doping the active layer 112, an undoped channel region is formed for each of the thin film transistors T1 to T7. A source region and a drain region, doped with a dopant, is on respective sides of the channel region. The source region and the drain region correspond respectively to a source electrode and a drain electrode. The dopant material depends on the conductivity type of the thin film transistor, e.g., an N-type dopant material or a P-type dopant material. The doping operation may be performed after a second insulating layer 103 is formed.

FIGS. 5 and 6 illustrate a portion of the channel region of the driving thin film transistor T1 and a portion of the drain region (drain electrode) of the second emission control thin film transistor T6 in the active layer 112.

A second insulating layer 103 is on the first gate line. The second insulating layer 103 may also function as a dielectric of capacitor Cst. The second insulating layer 103 may have a multilayer structure, in which an organic insulating material and/or an inorganic insulating material are alternately formed.

The second gate wiring including the second electrode Cst2 of capacitor Cst is formed on second insulating layer 103. The second gate wiring further includes initialization voltage line VL. Like the first gate wiring, the second gate wiring may have a single-layer structure or a multilayer structure, including a metal material, e.g., Pt, Pd, Ag, Mg, Au, Ni, Nd, Ir, Cr, Li, Ca, Mo, Ti, W, Al, Cu, or an alloy thereof.

A third insulating layer 104 is on the substrate 100 having the second gate wiring thereon. Like the first insulating layer 102 and the second insulating layer 103, the third insulating layer 104 may have a multilayer structure, in which an organic insulating material and/or an inorganic insulating material are alternately formed.

The data wiring including the driving voltage line PL, the first connection member 120, and the second connection member 130 are formed on the substrate 100, having the third insulating layer 104 thereon. As illustrated in FIG. 7, the data wiring further includes the data line DLm and the third connection member 140, in addition to the driving voltage line PL and the first and second connection members 120 and 130.

The driving voltage line PL is connected to the second electrode Cst2 of capacitor Cst through the contact holes 47 and 48. The first connection member 120 may connect the drain electrode D6 of the second emission control thin film transistor T6 to the OLED, for example, by a pixel electrode connected through via hole VIA. The second connection member 130 is connected to the first electrode Cst1 of the capacitor Cst and the gate electrode G1 of the driving thin film transistor T1 through a contact hole 41.

A region passing through the capacitor Cst is removed from the driving voltage line PL. because driving voltage line PL is connected to both edges of the second electrode Cst2 of the capacitor Cst, the driving voltage line PL may have a mesh structure. An additional space may be formed on the capacitor Cst. because first connection member 120 is disposed in the additional space on the capacitor Cst, a sufficient horizontal distance between the date wiring may be ensured.

Like the first gate wiring and second gate wiring, the data wiring may have a single-layer structure or a multilayer structure, including a metal material, e.g., Pt, Pd, Ag, Mg, Au, Ni, Nd, Ir, Cr, Li, Ca, Mo, Ti, W, Al, Cu, or an alloy thereof. In one embodiment, the data wiring may be formed to have a three-layer structure of Ti/Al/Ti.

A passivation layer 105 may be formed on the third insulating layer 104 to cover the data wiring. A via hole VIA is formed in the passivation layer 105. An anode electrode (pixel electrode) of the OLED is formed on the passivation layer 105 to cover the via hole VIA.

A pixel definition layer is formed on the passivation layer 105 and an edge of the pixel electrode. The pixel definition layer has a pixel opening portion exposing the pixel electrode. The pixel definition layer may be formed, for example, of polyacrylate-based resins, polyimide-based organic materials, or silica-based inorganic materials. An organic emission layer on the pixel electrode may be exposed by the pixel opening portion. A cathode electrode (e.g., common electrode) is formed on the organic emission layer over the substrate 100. Thus, an OLED including the pixel electrode, the organic emission layer, and the common electrode is formed.

In another embodiment, the pixel electrode may be a cathode electrode and the common electrode may be an anode electrode.

Figure 8:
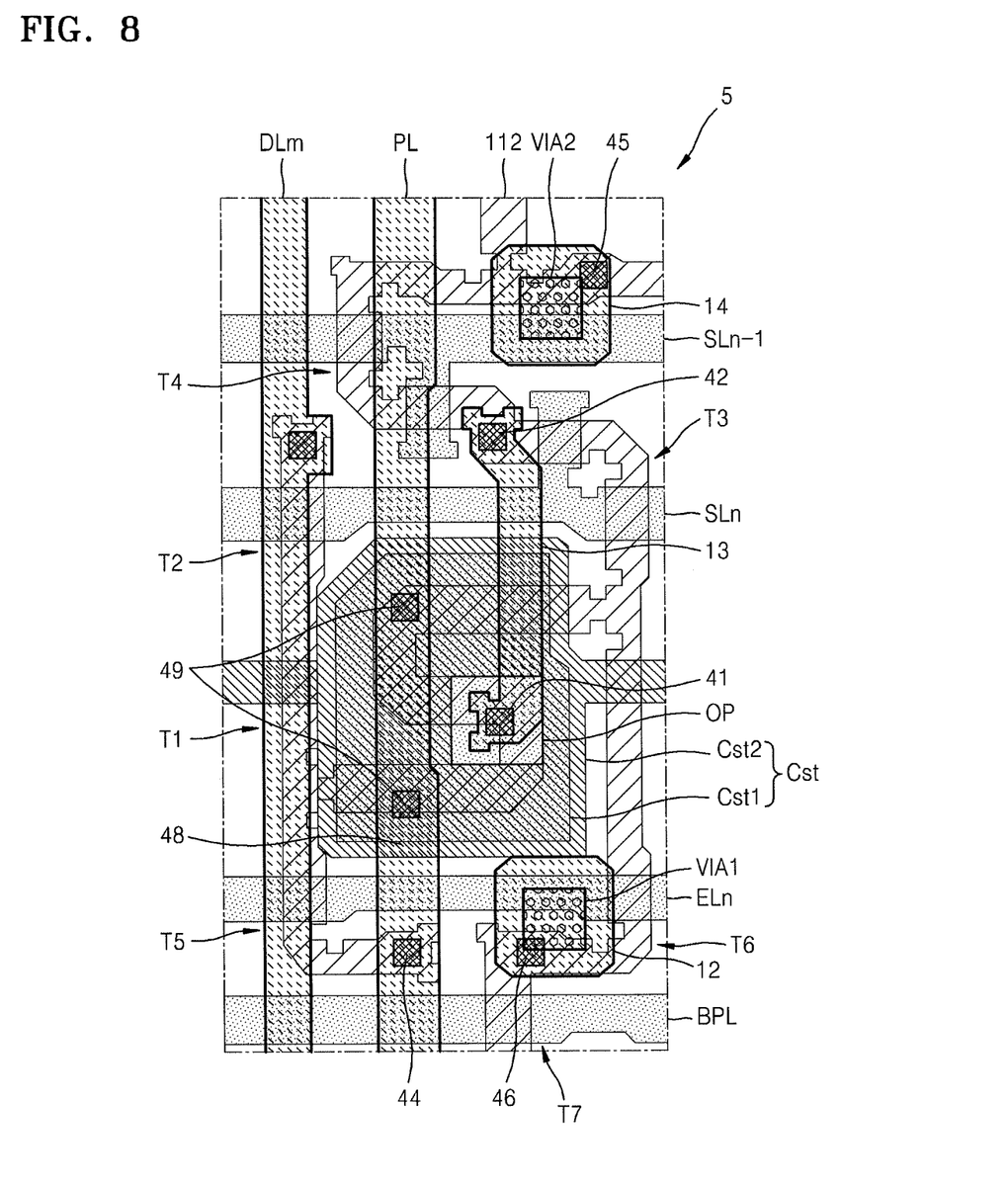
FIG. 8 illustrates a pixel according to a comparative example.
Figure 9:
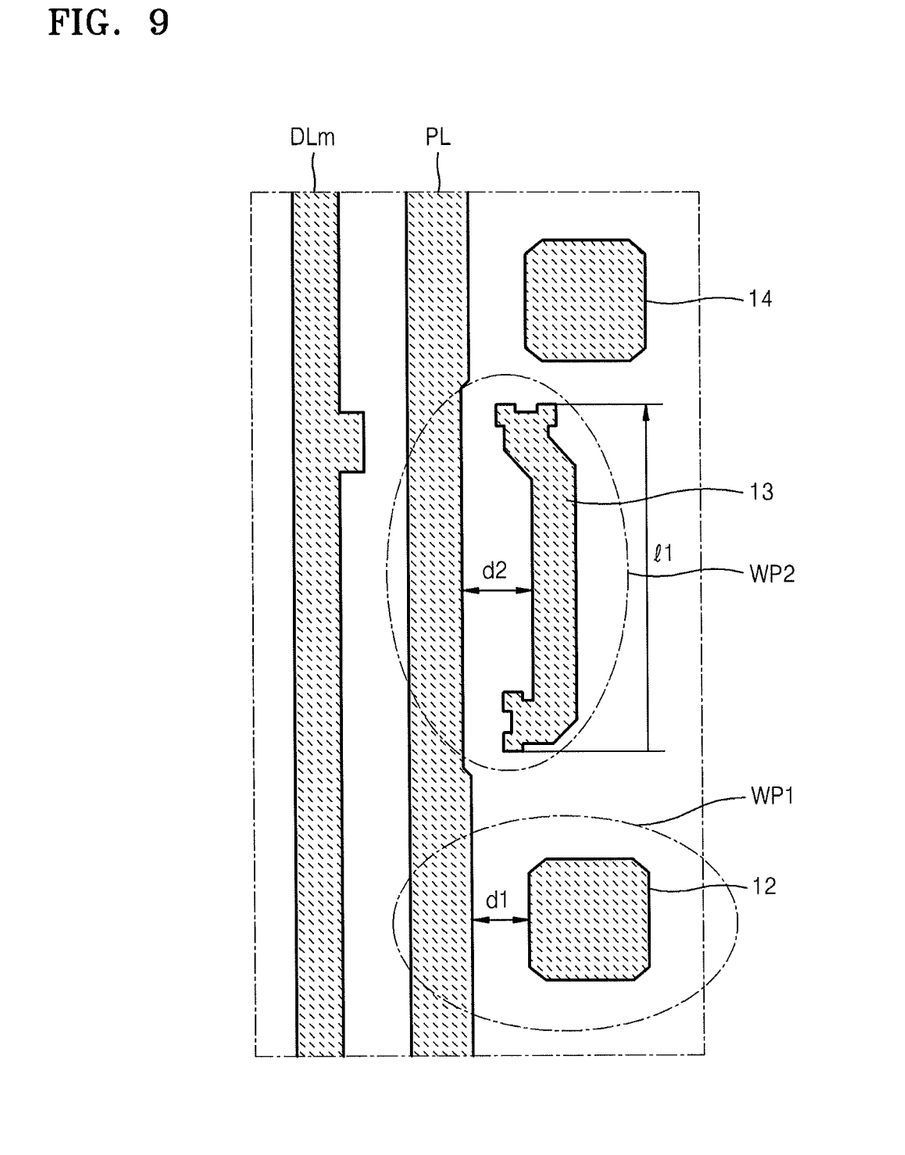
FIG. 9 illustrates a data line in FIG. 8.

FIG. 8 illustrates a plan view of another pixel, and FIG. 9 illustrates a data line in FIG. 8. Referring to FIG. 8, a pixel 5 includes a first scan line SLn, a second scan line SLn-1, an emission control line ELn, an initialization voltage line VL, and a bypass control line BPL disposed in a row direction. These lines respectively apply a first scan signal Sn, a second scan signal Sn-1, an emission control signal En, an initialization voltage Vint, and a bypass signal BP. A data line DLm and a driving voltage line PL are disposed across the first scan line SLn, the second scan line SLn-1, the emission control line ELn, the initialization voltage line VL, and the bypass control line BPL. The data line DLm and the driving voltage line PL respectively apply a data signal Dm and a first power supply voltage ELVDD to pixel 5.

The pixel 5 includes the seven thin film transistors T1 to T7 and a capacitor Cst. In other embodiments, a different number of transistors and/or capacitors may be included. Also, an OLED may be formed in a region corresponding to a via hole VIA.

The thin film transistors T1 to T7 and the capacitor Cst in FIG. 8 may be formed in the same manner as the thin film transistors T1 to T7 and the capacitor Cst in FIG. 4. The following description will focus on differences in structure between the pixel 5 and the pixel 3.

Referring to FIGS. 8 and 9, active layer 112 is formed, and first gate wiring is formed on the active layer 112. The second gate wiring is formed on the first gate wiring. Data wiring is formed on the second gate wiring. An insulating layer is formed between the active layer 112 and first gate wiring, between the first gate wiring and the second gate wiring, and between the second gate wiring and the data wiring. A passivation layer may be formed on the data wiring.

The first gate wiring includes the gate electrodes G1 to G7 of the thin film transistors T1 to T7, the first scan line SLn, the second scan line SLn-1, the emission control line ELn, and the bypass control line BPL. The second gate wiring includes the second electrode Cst2 of the capacitor Cst. The data wiring includes data line DLm, the driving voltage line PL, a first connection member 12, a second connection member 13, and a third connection member 14.

A pixel electrode (e.g., anode electrode) of the OLED is formed to cover a first via hole VIA1, to connect the second emission control thin film transistor T6 and OLED. The initialization voltage line VL is formed in parallel to the first and second scan lines SLn and SLn-1 to cover a second via hole VIA2, to connect initialization thin film transistor T4 and initialization voltage line VL.

The first connection member 12 is substantially tetragonal. The first connection member 12 is connected to the drain electrode D6 of the second emission control thin film transistor T6 through a contact hole 46. The first connection member 12 is connected to the anode electrode of the OLED through the via hole VIA, formed in a region adjacent to contact hole 46.

The driving voltage line PL is formed across the capacitor Cst parallel to the data line DLm in the vertical direction without disconnection. The driving voltage line PL is connected to the second electrode Cst2 of capacitor Cst through a contact hole 49. In alaternative embodiments, the row and column directions may be vertical and horizontal directions, respectively.

The second connection member 13 is connected to the first electrode Cst1 of capacitor Cst through a contact hole 41 in a region corresponding to an opening OP, formed in a substantially central portion of the second electrode Cst2 of the capacitor Cst. The second connection member 13 is connected to drain electrode D3 of the compensation thin film transistor T3 through a contact hole 42, for example, by extending in the vertical direction in a substantially linear shape.

The third connection member 14 is substantially tetragonal, and is connected to the source electrode S4 of the initialization thin film transistor T4 through the contact hole 45.

In the comparative example of FIGS. 8 and 9, because a distance dl between the first connection member 12 and the driving voltage line PL, which are adjacent to each other on the same layer in a first weak point region WP1, and a distance d2 between the second connection member 13 and the driving voltage line PL, which are adjacent to each other on the same layer in a second weak point region WP2, are small, an inter-line short circuit may frequently occur in the first weak point region WP1 and second weak point region WP2.

In contrast, in the embodiment of FIG. 7, a portion of driving voltage line PL passing through a region of capacitor Cst is removed. As a result, the driving voltage line PL does not pass through the region of the capacitor Cst. Also, a narrow first portion 121 of the first connection member 120 is connected to the drain electrode D6 of the second emission control thin film transistor T6. A wide second portion 122 of the first connection member 120 is disposed on the capacitor Cst from which the driving voltage line PL is removed. Accordingly, in FIG. 7, first weak point region WP1 in FIG. 9 is shifted to a third weak point region WP3 in which the capacitor Cst is formed. Also, a distance d3 between the first connection member 120 and the adjacent driving voltage line PL, and a distance d4 between the first connection member 120 and the data line DLm, may be greater than distance dl in the comparative example of FIG. 9.

Also, in the embodiment of FIG. 7, a length 12 of the second connection member 130 (connecting the drain electrode D3 of compensation thin film transistor T3) and the first electrode Cst1 of capacitor Cst in a fourth weak point region WP4 (e.g., a region corresponding to second weak point region WP2 in FIG. 9) is smaller than a length 11 of the second connection member 13 in the second weak point region WP2. As a result, an opening illustrated in FIG. 8 of the comparative example is not formed in the second electrode Cst2 of the capacitor Cst. Also, as illustrated in FIG. 4, an outer portion of the second electrode Cst2 adjacent to the compensation thin film transistor T3 is removed. The second connection member 130 is connected to an edge portion of the first electrode Cst1 under a region from which the second electrode Cst2 is removed. Accordingly, the fourth weak point region WP4 (FIG. 7) may be smaller than the second weak point region WP2 in FIG. 9.

In accordance with one or more of the aforementioned embodiments, an additional space is ensured by removing a portion of the driving voltage line PL extending in the vertical direction, e.g., a portion of driving voltage line PL overlapping capacitor Cst. Because the position of first weak point region WP1 of the comparative example is shifted to the third weak point region WP3 (in order to increase the distance of the adjacent lines formed on the same layer), restriction in the horizontal direction may be reduced or minimized. Also, the fourth weak point region WP4 corresponding to second weak point region WP2 of the comparative example may be reduced. Accordingly, the likelihood of an inter-line short circuit occurring may be reduced.

Figure 10:
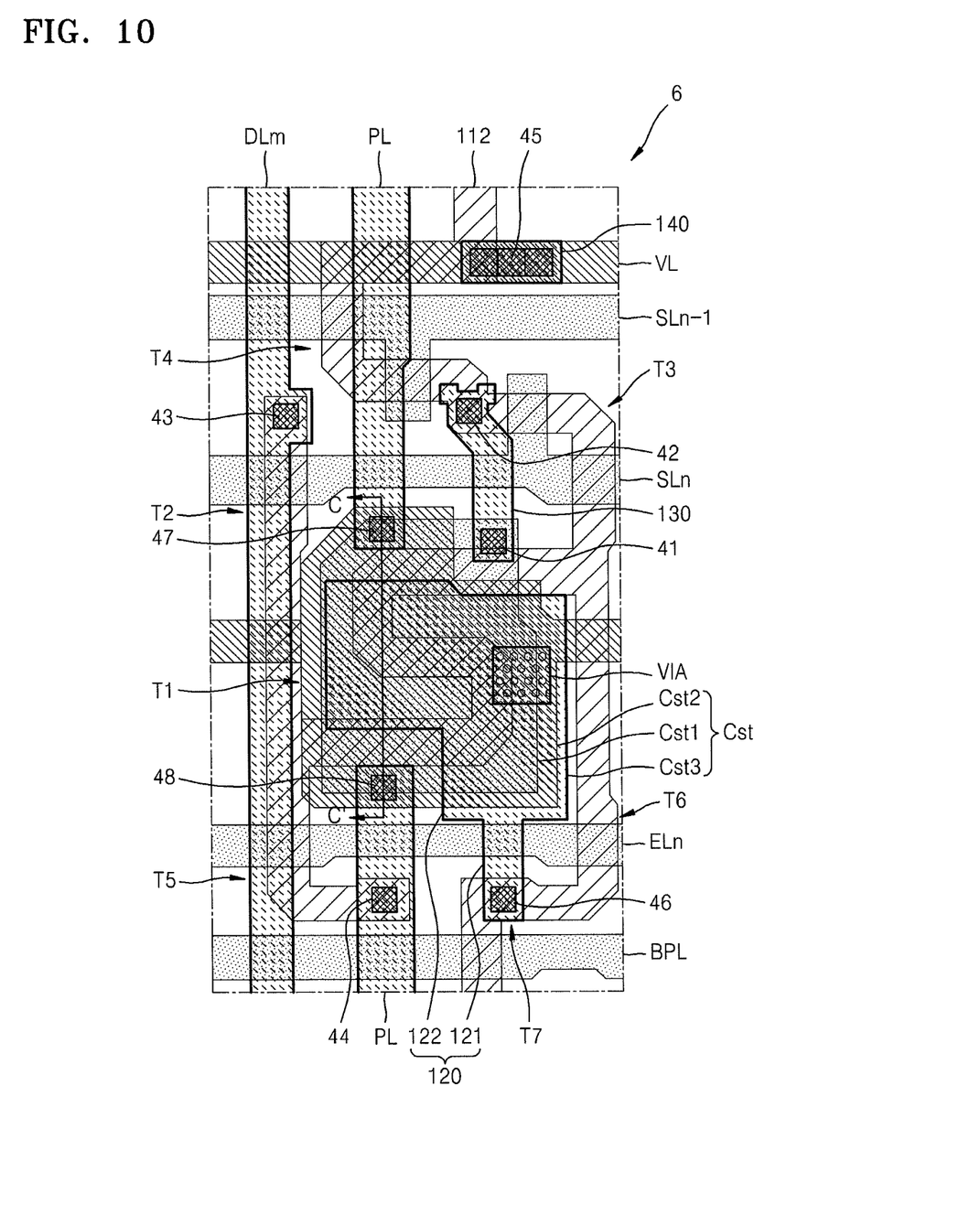
FIG. 10 illustrates another embodiment of a pixel.
Figure 11:
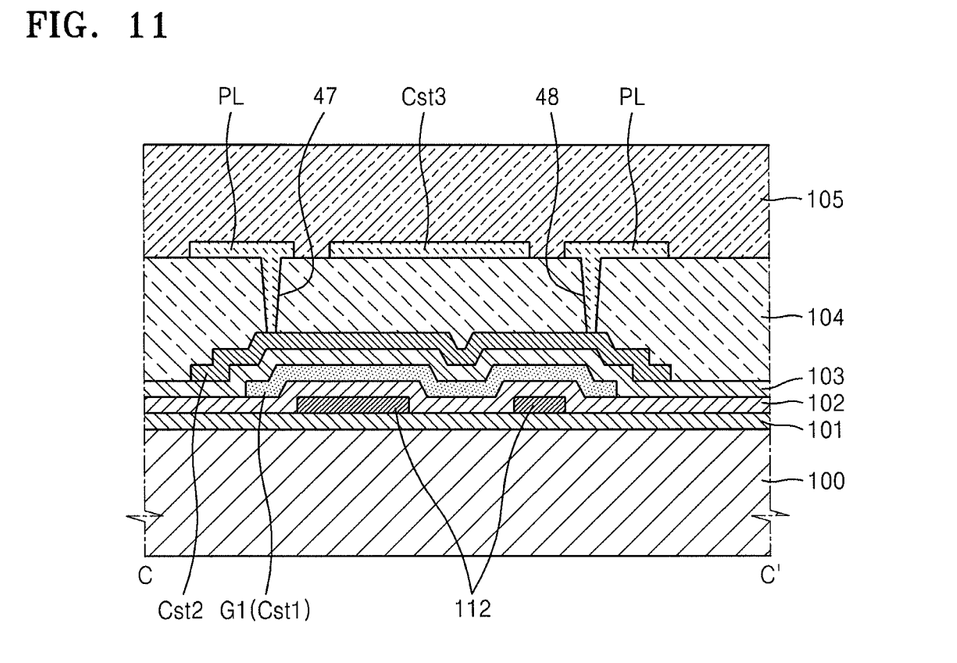
FIG. 11 illustrates a view along line section line C-C' in FIG. 10.

FIG. 10 illustrates another embodiment of a pixel 6, and FIG. 11 illustrates a view along section line C-C' in FIG. 10.

Pixel 6 may be similar to pixel 3, except that a first connection member 120 also functions as a third electrode Cst3 of a capacitor Cst.

Referring to FIGS. 10 and 11, because the driving voltage line PL is separated, e.g., does not overlap, the driving thin film transistor T1, a space (through which a line does not pass) may be formed on the capacitor Cst. Because of the separation, driving voltage line PL disposed in an upper portion of the capacitor Cst is connected to a top edge of the second electrode Cst2 of the capacitor Cst through the contact hole 47. Driving voltage line PL disposed in a lower portion of the capacitor Cst is connected to a bottom edge of the second electrode Cst2 of the capacitor Cst through the contact hole 48.

Because the second electrode Cst2 of capacitor Cst is connected between adjacent pixels in the horizontal direction, the driving voltage line PL may have a mesh structure connected in the vertical and horizontal directions. Also, driving voltage line PL is connected to the first emission control thin film transistor T5 through contact hole 44. FIG. 11 illustrates a channel region of an active layer of the driving thin film transistor T1 in the active layer 112.

The first connection member 120 is connected to the drain electrode D6 of second emission control thin film transistor T6 through the contact hole 46. The first connection member 120 is connected to the anode electrode of the OLED through the via hole VIA. Accordingly, the first connection member 120 may connect the OLED to the driving thin film transistor T1 and the second emission control thin film transistor T6.

The first connection member 120 includes a first portion 121 parallel to the driving voltage line PL, and a second portion 122 formed at a portion of the region in which the driving voltage line PL is separated. The first portion 121 is substantially linear, and the second portion 122 is substantially polygonal. The second portion 122 has a larger width and area than the first portion 121.

The via hole VIA is formed to correspond to a portion of the second portion 122 of the first connection member 120, and is disposed at a portion on the driving thin film transistor T1 and the capacitor Cst. The first portion 121 has a width sufficient to prevent a short circuit with driving voltage line PL, disposed on the same layer as the first portion 121. The second portion 122 of the first connection member 120 may be formed to maximally overlap with the first electrode Cst1 and the second electrode Cst2 of capacitor Cst. As a result, the second portion 122 may also function as the third electrode Cst3 of the capacitor Cst. Because the capacitor Cst has a triple-electrode structure, the capacitance thereof may be increased.

The second connection member 130 is connected to the first electrode Cst1 of capacitor Cst through the contact hole 41 at an edge of the first electrode Cst1, for example, at one corner of first electrode Cst1. The second connection member 130 is connected to the drain electrode D3 of the compensation thin film transistor T3 through the contact hole 42. Accordingly, the second connection member 130 may connect the capacitor Cst to the compensation thin film transistor T3 and the initialization thin film transistor T4.

The third connection member 140 may connect the source electrode S4 of the initialization thin film transistor T4 and the initialization voltage line VL through contact hole 45.

Although some of the aforementioned pixel embodiments have a 6Tr-1Cap structure (e.g., six thin film transistors and one capacitor) and other embodiments have a 7Tr-1Cap structure (e.g., seven thin film transistors and one capacitor), a different number of transistors and/or capacitors may be included in alternative embodiments. Thus, the organic light-emitting display apparatus may include a plurality of thin film transistors and one or more capacitors in one pixel, and may have various structures in which an additional line is further formed or a line is omitted.

In accordance with one or more of the aforementioned embodiments, a distance between lines on a same layer in an organic light-emitting display apparatuses may be sufficiently spaced to prevent inter-line short circuits, thereby increasing yield.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display apparatus comprising a plurality of pixels, each pixel comprising:
   a first thin film transistor including an active layer curved in a plane substantially parallel to a substrate and a gate electrode overlapping a channel region between a source region and a drain region of the active layer;
   a capacitor having a first electrode and a second electrode overlapping the first electrode, the first electrode being the gate electrode of the first thin film transistor;
   a driving voltage line comprising a first line and a second line facing the first line on a same layer, wherein the first line is connected to a first portion of edges of the second electrode of the capacitor and the second line is connected to a second portion opposing to the first portion of edges of the second electrode of the capacitor; and
   a first connection line overlapping rest portion except the first and second edge of the second electrode of the capacitor, wherein a portion of first connection line overlaps a via hole, wherein the first line and the second line of the driving voltage line are extended along a first direction and do not overlap the rest portion of the second electrode of the capacitor.

2. The apparatus as claimed in claim 1, wherein the first connection line has: a first portion parallel to the driving voltage line, and a second portion having a greater width than the first portion, wherein the via hole overlaps the second portion.

3. The apparatus as claimed in claim 1, further comprising:
   a second thin film transistor connected to the first thin film transistor; and
   a second connection line connected to the first electrode of the capacitor and the second thin film transistor.

4. The apparatus as claimed in claim 3, wherein the driving voltage line, the first connection line, and the second connection line are on the same layer.

5. The apparatus as claimed in claim 2, wherein the second portion of the first connection line overlaps the rest portion of the second electrode and the first electrode of the capacitor and is between the first line and the second line of the driving voltage line on the same layer.

6. The substrate as claimed in claim 1, further comprising:
   a first insulating layer between the active layer and the first electrode of the capacitor;
   a second insulating layer between the first electrode and the second electrode of the capacitor;
   a third insulating layer between the second electrode of the capacitor and the first connection line; and
   a fourth insulating layer on the first connection line and having the via hole.

7. The apparatus as claimed in claim 1, further comprising a pixel electrode connected to the first connection line through the via hole.

8. The apparatus as claimed in claim 1, wherein the second electrodes of the capacitors of pixels adjacent along a second direction perpendicular to the first direction are connected to each other.

9. An organic light-emitting display apparatus, comprising:
   a substrate;
   an active layer comprising a source region, a drain region and a channel region between the source region and the drain region;
   a first insulating layer on the active layer;
   a first electrode on the first insulating layer and overlapping the channel region of the active layer; a second insulating layer on the first electrode;
   a second electrode on the second insulating layer and overlapping the first electrode;
   a third insulating layer on the second electrode;
   a driving voltage line on the third insulating layer and comprising a first line connected to a first portion of edges of the second electrode and a second line connected to a second portion opposing to the first portion of edges of the second electrode; and
   a first connection line on the third insulating layer and overlapping rest portion except the first and second portions of the second electrode; and
   a fourth insulating layer on the first connection line and having a via hole which overlaps a portion of the first connection line.

10. The apparatus as claimed in claim 9, wherein the first connection line has:
    a first portion parallel to the driving voltage line; and
    a second portion having a greater width than the first portion,
    wherein the via hole overlaps the second portion.

11. The apparatus as claimed in claim 9, further comprising:
    a second connection line connected to the first electrode of the capacitor.

12. The apparatus as claimed in claim 11, wherein the second connection line is connected to an edge of the first electrode.

13. The apparatus as claimed in claim 11, wherein the driving voltage line, the first connection line, and the second connection line are on a same layer.

14. The apparatus as claimed in claim 10, wherein the second portion of the first connection line overlaps the rest portion of the second electrode and the first electrode of the capacitor and is between the first line and the second line of the driving voltage line.

15. The apparatus as claimed in claim 9, further comprising:
    an organic light-emitting device on the fourth insulating layer and comprising a pixel electrode connected to the first connection line through the via hole.

* * * * *